(12) United States Patent
Chen et al.

(10) Patent No.: US 7,253,480 B2
(45) Date of Patent: Aug. 7, 2007

(54) STRUCTURE AND FABRICATION METHOD OF ELECTROSTATIC DISCHARGE PROTECTION CIRCUIT

(75) Inventors: Shiao-Shien Chen, Chung-Li (TW); Tsun-Lai Hsu, Hsinchu Hsien (TW); Tien-Hao Tang, Taipei Hsien (TW); Hua-Chou Tseng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 42 days.

(21) Appl. No.: 10/951,373

(22) Filed: Sep. 28, 2004

(65) Prior Publication Data

US 2005/0045956 A1 Mar. 3, 2005

Related U.S. Application Data

(63) Continuation of application No. 10/134,835, filed on Apr. 29, 2002, now abandoned.

(30) Foreign Application Priority Data

Apr. 22, 2002 (TW) .............................. 91108181 A

(51) Int. Cl.
*H01L 23/62* (2006.01)
(52) U.S. Cl. ...................... 257/355; 438/309; 438/322

(58) Field of Classification Search ................ 257/355, 257/356, 357, 358, 359, 360, 361, 362, 363; 438/309, 322
See application file for complete search history.

(56) References Cited

U.S. PATENT DOCUMENTS

| 4,825,275 | A  | * | 4/1989  | Tomassetti ................... 257/370 |
| 5,589,405 | A  | * | 12/1996 | Contiero et al. ............. 438/268 |
| 6,424,013 | B1 | * | 7/2002  | Steinhoff et al. ............ 257/355 |
| 6,525,376 | B1 | * | 2/2003  | Harada et al. ............... 257/343 |
| 6,570,229 | B1 | * | 5/2003  | Harada ......................... 257/373 |
| 2001/0002059 | A1 | * | 5/2001  | Wong et al. .................. 257/510 |
| 2002/0050619 | A1 | * | 5/2002  | Kawaguchi et al. ......... 257/368 |
| 2002/0142507 | A1 | * | 10/2002 | Egashira ....................... 438/48 |
| 2003/0049907 | A1 | * | 3/2003  | Omi et al. .................... 438/286 |

* cited by examiner

*Primary Examiner*—Hsien-Ming Lee
*Assistant Examiner*—Su C. Kim
(74) *Attorney, Agent, or Firm*—J.C. Patents

(57) ABSTRACT

A structure of an electrostatic discharge protection circuit, in which a buried layer is formed in the substrate of the electrostatic discharge protection circuit, and a sinker layer electrically connected to the buried layer and a drain is also formed therein. Thereby, when the electrostatic discharge protection circuit is activated, the current flows from a source through the buried layer and the sinker layer to the drain. The current flow path is remote from the gate dielectric layer to avoid damaging the gate dielectric by a large current, so as to improve the dielectric strength of the electrostatic discharge protection circuit.

11 Claims, 12 Drawing Sheets

STRUCTURE AND FABRICATION METHOD OF ELECTROSTATIC DISCHARGE PROTECTION CIRCUIT

CROSS-REFERENCE TO RELATED APPLICATION

This application is a continuation of a prior application Ser. No. 10/134,835, filed on Apr. 29, 2002 now abandoned. The prior application Ser. No. 10/134,835 claims the priority benefit of Taiwan application serial no. 91108181, filed on Apr. 22, 2002. All disclosures are incorporated herewith by reference.

BACKGROUND OF THE INVENTION

1. Field of the Invention

The invention relates in general to a structure and a fabrication method of an electrostatic discharge protection circuit. More particularly, the invention relates to a structure and a fabrication method of an electrostatic discharge protection circuit, in which a sinker layer and a buried layer are formed to provide a low resistant current path.

2. Description of the Related Art

The electrostatic discharge is an electrostatic drift phenomenon from a surface of a non-conductor that damages semiconductors or other circuit components in an integrated circuit. For example, hundreds to thousands of volts of static electricity carried by a human body walking on a blanket under a higher relative humidity can be detected. When the relative humidity is lower, more than ten thousand volts of electrostatic voltage can be detected. The equipment for packaging or testing integrated circuits also generates hundreds to thousands of volts of static electricity. When brought into contact with the above charge carriers (human body, equipment or instrument), the chips are discharged thereto. The surge caused by such electrostatic discharge may damage the integrated circuit of the chip or even cause failure of the integrated circuit.

To prevent damage to the integrated circuit of the chip, various mechanisms to suppress the electrostatic discharge have been proposed. Most commonly, hardware prevention is applied by forming an on-chip electrostatic discharge protection circuit between the internal circuit and each pad thereof.

FIG. 1 shows a schematic structure of a conventional NMOS electrostatic discharge protection circuit.

Referring to FIG. 1, a P well 102 is formed in a P-type substrate 100, and an NMOS transistor 104 and a P+ substrate-connecting region 114 are formed in the P well 102.

The above NMOS transistor 104 comprises a gate 106, a source 108, and a drain 110. The P+ substrate-connecting region 114 is isolated from the NMOS transistor 104 by a shallow trench isolation layer 112.

A guard ring 118 is formed on the substrate 100 surrounding the P+ substrate-connecting region 114. For the NMOS transistor 104, the guard ring 118 includes an N+ doped region with a conductive type opposite to that of the P well 102. The guard ring 118 and the P+ substrate-connecting region 114 are isolated from each other by a shallow trench isolation layer 116.

Referring to FIG. 2, the resistance of the substrate 100 is decreased as the voltage applied to the drain 110 is increased. When the voltage exceeds $Vt_1$, the resistance of the substrate 100 is reduced sufficiently to switch on the PN junction near the source 108. Meanwhile, the parasitic bipolar transistor is activated to generate a snapback voltage. Such snapback voltage rapidly drops to voltage $V_{Sb}$ and simultaneously conducts the electrostatic discharge current.

However, the flow path of the electrostatic discharge current is normally along a surface of the gate dielectric layer. When such current is large, the thermal energy generated thereby is concentrated near the flow path, that is, near the surface of the gate dielectric layer. A large thermal energy may blow the gate dielectric to cause failure of the electrostatic discharge protection circuit.

SUMMARY OF THE INVENTION

The invention provides a structure and a fabrication method of an electrostatic discharge protection circuit, by which the protection performance of the electrostatic discharge protection circuit is enhanced.

The invention further provides a structure and a fabrication method of an electrostatic discharge protection circuit, by which the heat dissipation performance of the electrostatic discharge protection circuit is improved.

The structure of the electrostatic discharge protection circuit includes a substrate, a well, a transistor, a substrate-connecting region, a first isolation layer, a sinker layer, and a buried layer. The well is formed in the substrate, while the transistor is formed in the well. The transistor comprises a gate, a drain and a source. The substrate-connecting region is located in the well and isolated from the source and drain by the first isolation layer. The buried layer is formed at a junction between the well and the substrate under the transistor. The sinker layer is formed in the well and is electrically connected to the buried layer and the drain. The sinker layer and the buried layer have dopant with opposite conductive type to that of the well.

The above electrostatic discharge protection circuit further comprises a guard ring formed in the substrate. The guard ring is isolated from the substrate-connecting region by a second isolation layer. The guard ring is doped with a conductive type opposite to that of the well.

The invention further provides a method for fabricating an electrostatic discharge circuit. A substrate is provided. A well is formed in the substrate. At a lateral junction between the substrate and the well, a buried layer is formed. A sinker layer is further formed in the well to electrically connect the buried layer. A gate is formed in the well, and a source and a drain are formed in the well at two sides of the gate. The drain is electrically connected to the sinker layer. A substrate-connecting region is then formed in the well.

According to the above, in the electrostatic discharge protection circuit, a buried layer and a sinker layer electrically connected to the drain and the buried layer are formed. When the electrostatic discharge protection circuit is activated, the current flows in the substrate from the source through the buried layer and the sinker layer to the drain. Therefore, a large current flowing through a surface of the gate dielectric layer is prevented. Further, the gate dielectric layer is prevented from being blown. As a result, the dielectric strength of the electrostatic discharge protection circuit is increased, and the protection effect is enhanced.

Further, as the current flows in the substrate through the path from the source, the buried layer, the sinker layer to the drain, the thermal energy generated thereby is effectively dissipated. The heat dissipation performance of the electrostatic discharge protection circuit is significantly enhanced.

Both the foregoing general description and the following detailed description are exemplary and explanatory only and are not restrictive of the invention, as claimed.

DESCRIPTION OF THE PREFERRED EMBODIMENTS

Figure 1:
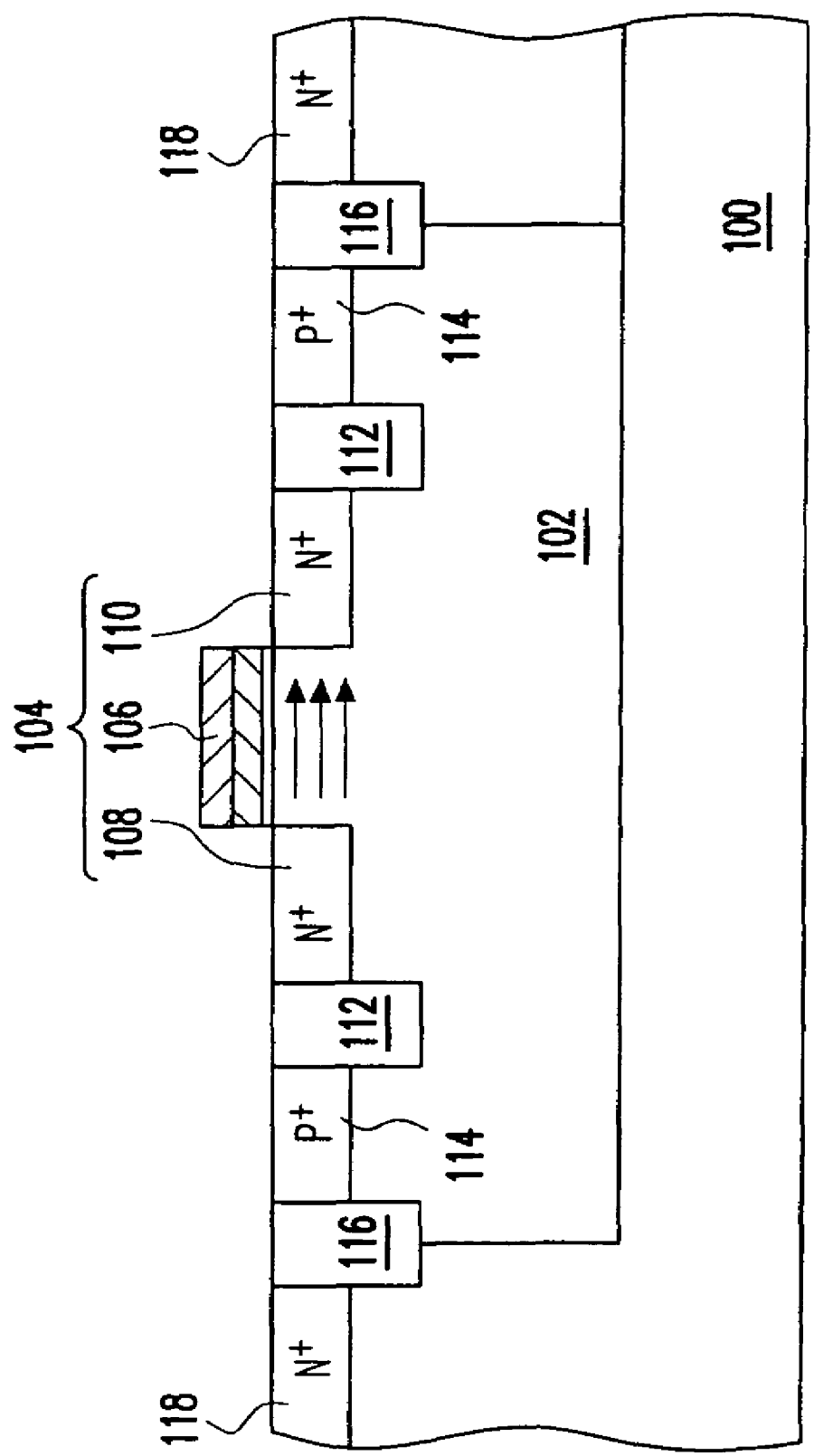
FIG. 1 shows a schematic drawing of a conventional electrostatic discharge protection circuit.
Figure 2:
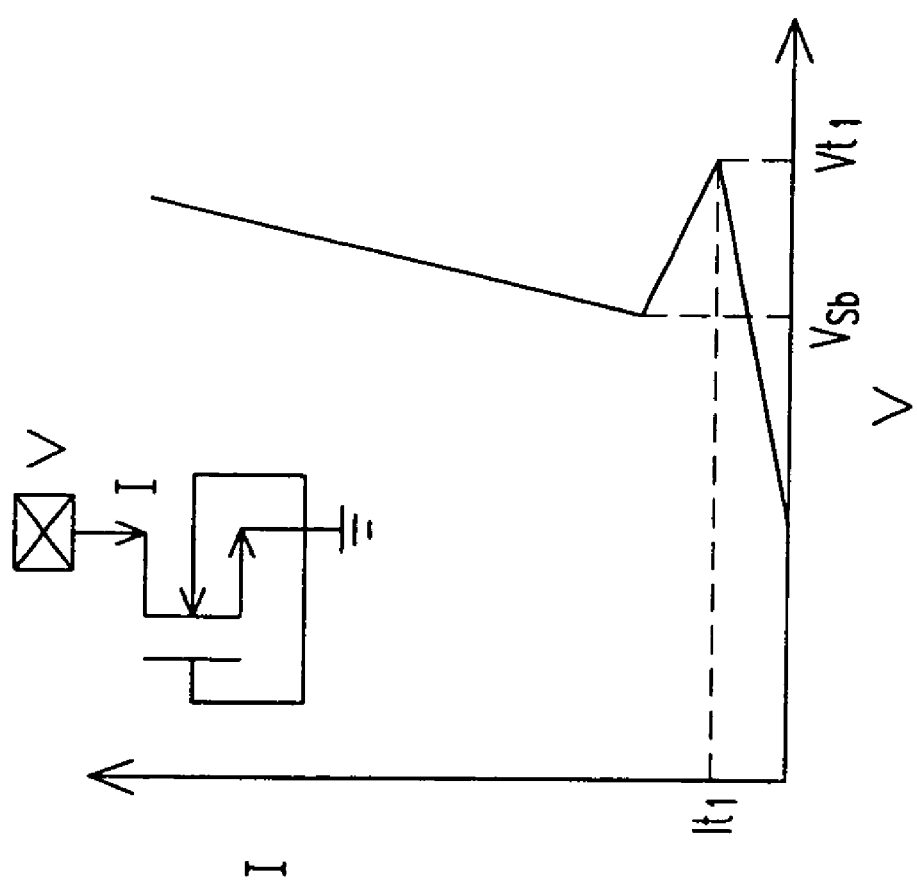
FIG. 2 shows a characteristics curve of a parasitic bipolar transistor.
Figure 3A:
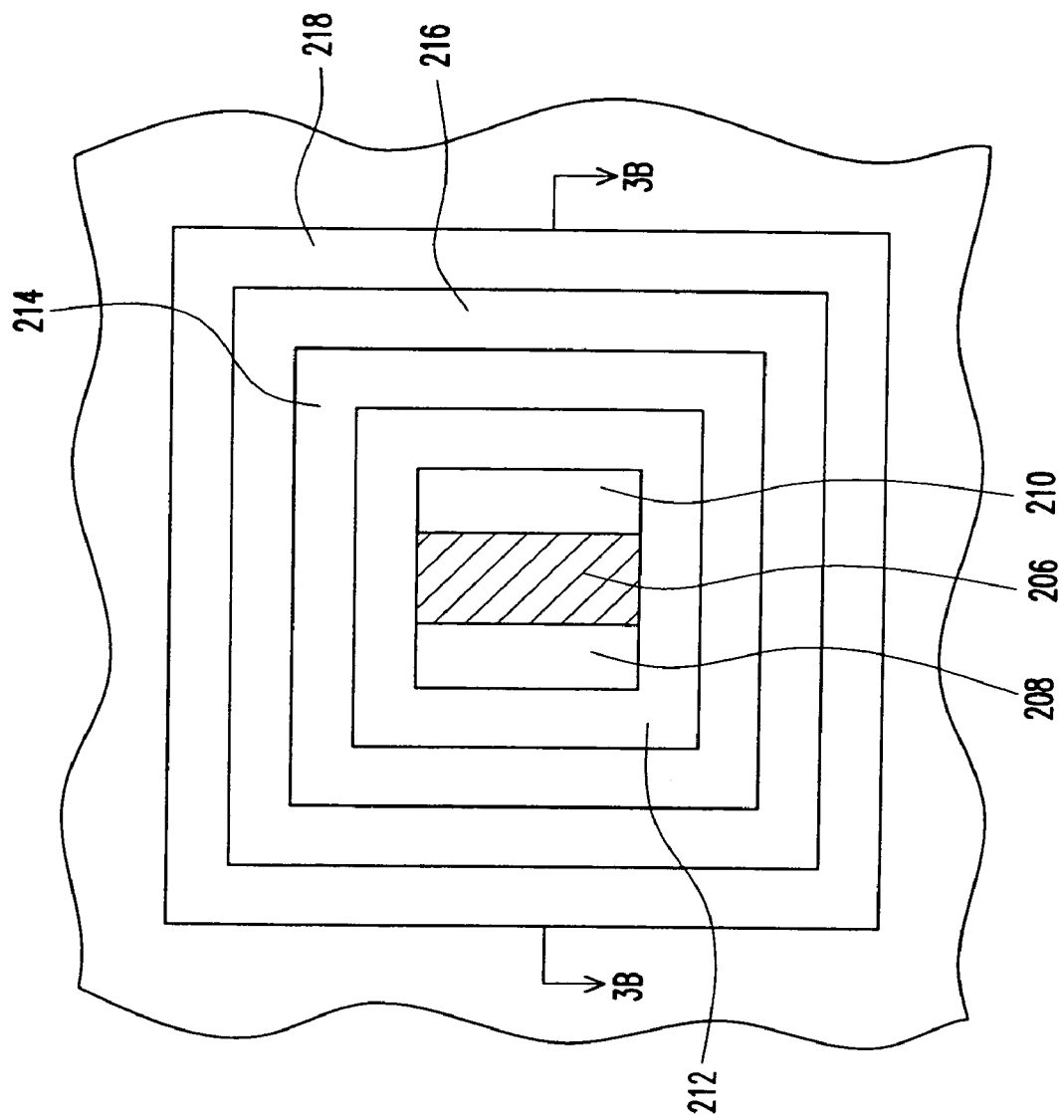
FIG. 3A shows a top view of a structure of an electrostatic discharge protection circuit in one embodiment of the invention.
Figure 3B:
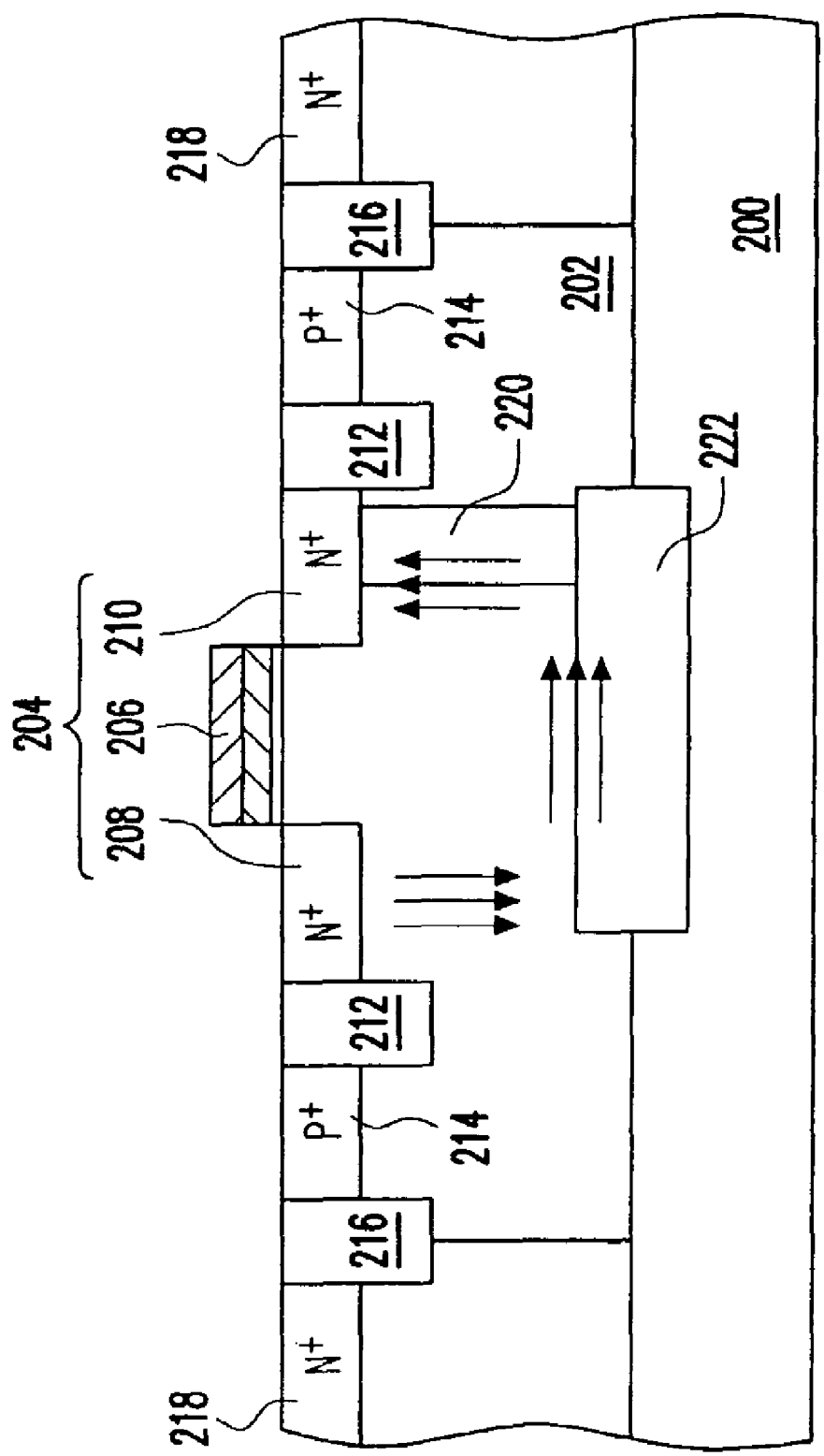
FIG. 3B shows a cross-sectional view of the electrostatic discharge protection circuit as shown in FIG. 3A.

FIG. 3A shows a top view of an electrostatic discharge protection circuit in one embodiment of the invention, while FIG. 3B shows a cross-sectional view thereof.

Referring to FIG. 3A and FIG. 3B, the electrostatic discharge protection circuit provided by the invention includes a substrate 200, a well 202, an NMOS transistor 204, a P+ substrate-connecting region 214, a shallow trench isolation layer 212, a sinker layer 220 and a buried layer 222.

The P well 202 is formed in the substrate 200 and is doped with a first conductive type impurity.

The NMOS transistor 204 is formed in the P well 202. The NMOS transistor 204 has a gate 206, a source 208 and a drain 210. The source 208 and the drain 210 are formed in the P well 202 at two sides of the gate 206. The conductive type of the source 208 and the drain 210, which is the second conductive type, is opposite to the first conductive type of the P well 202.

The P+ substrate-connecting region 214 is formed in the P well at a periphery of the NMOS transistor 204. The P+ substrate-connecting region 214 is isolated from the NMOS transistor 204 by the shallow trench isolation layer 212.

The buried layer 222 is formed at a junction between the P well 202 and the substrate 200 under the transistor 204. The buried layer 222 is doped with the second conductive type of impurity, which is opposite to the first conductive type of the P well 202. The width of the buried layer 222 extends from the source 208 to the drain 210 of the NMOS transistor 204.

The sinker layer 220 is formed between the buried layer 222 and the drain 210 and is electrically connected to both the buried layer 222 and the drain 210. The doping type of the sinker layer 220 includes the second conductive type, and the width thereof is narrower than the width of the drain 210.

In addition, a guard ring 218 may be formed in the electrostatic discharge protection circuit. The guard ring 218 is formed in the substrate 200 and isolated from the P+ substrate-connecting region 214 of the NMOS transistor 204 by the shallow trench isolation layer 216. The guard ring 218 is doped with the second conductive type impurity, which is opposite to that of the P well 202.

The process for forming the sinker layer 220 includes performing a step of ion implantation after forming the buried layer 222. The sinker layer 220 electrically connected from a surface of the P well 202 to the buried layer 222 is thus formed in the P well 202.

The formation of the buried layer 222 and the sinker layer 220 provide a lower resistant path for electrostatic discharge current. The current thus flows from the source 208, through the buried layer 222 and the sinker layer 220 to the drain 210.

In the above embodiment, the structure of an NMOS electrostatic discharge protection circuit is used as an example for describing the invention. However, the application of the invention is not limited to the NMOS electrostatic discharge protection circuit. Instead, the invention can also be applied to the PMOS electrostatic discharge protection circuit. Under such circumstance, an N well is formed in a P substrate, and a PMOS transistor is formed in the N well. The buried layer is formed at a junction between the N well and the substrate under the PMOS transistor. The buried layer is doped with P type impurity, which is different from that of the N well. The sinker layer is electrically connected the drain and the buried layer. The sinker layer is doped with P type impurity, again, which is different from that of the N well.

In the above embodiment, the first conductive type includes P type, while the second conductive type includes N type. Or alternatively, the first and the second conductive types can be interchanged as N type and P type, respectively.

An embodiment for fabricating an electrostatic discharge protection circuit is shown in FIGS. 4A to 4H.

FIG. 4A to FIG. 4H illustrate an embodiment that incorporates processes for the electrostatic discharge protection circuit and a bipolar CMOS. For simplicity, the steps for forming the electrostatic discharge protection circuit and the PMOS device of the CMOS are omitted.

Figure 4A:
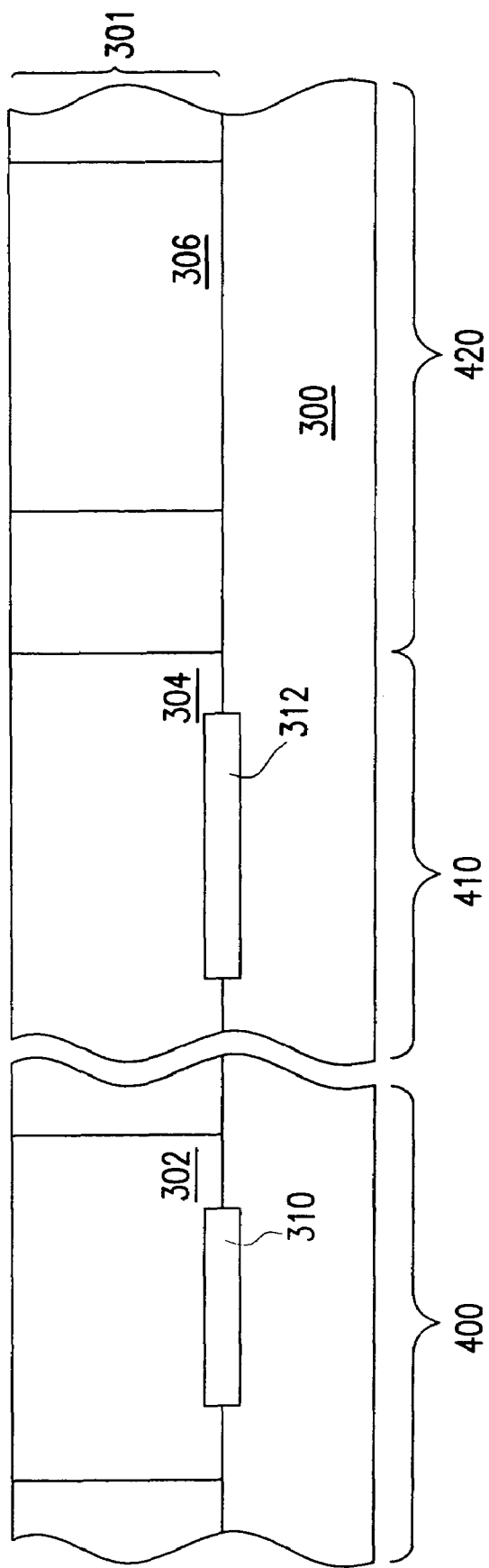
FIG. 4A to FIG. 4H show the process flow that incorporates both fabrication process of the electrostatic discharge protection circuit and the bipolar CMOS (BiCMOS) process.

Referring to FIG. 4A, a substrate 300 is provided. The substrate 300 is divided into an electrostatic discharge protection circuit (ESD) region 400, a bipolar transistor (bipolar) region 410 and a CMOS transistor (CMOS) region 420.

Buried layers 310, 312 are first formed on the substrate 300, and the a doped epitaxy layer 301 is formed over the substrate 300. P wells 302 and 306 are formed in the ESD region 400 and the CMOS region 420, respectively, while an N well 304 is formed in the bipolar region 410.

Figure 4B:
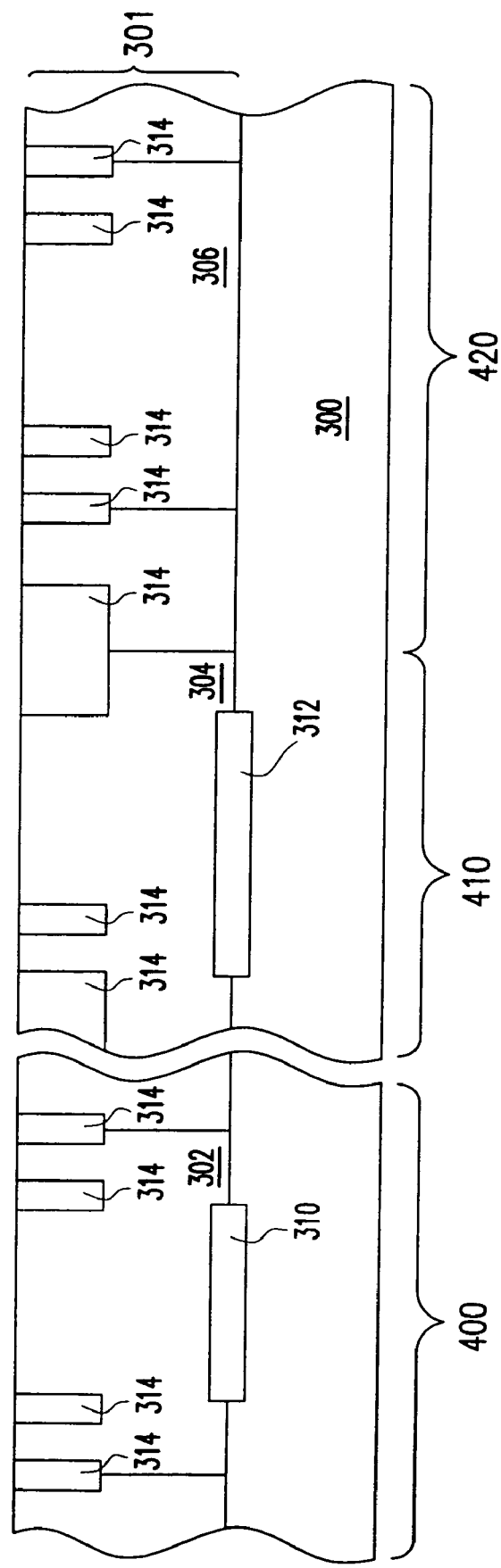

Referring to FIG. 4B, an isolation layer 314 is formed in the epitaxy layer 301. The isolation layer 314 includes a shallow trench isolation layer and is formed to isolate devices, or different regions in the same device.

Figure 4C:
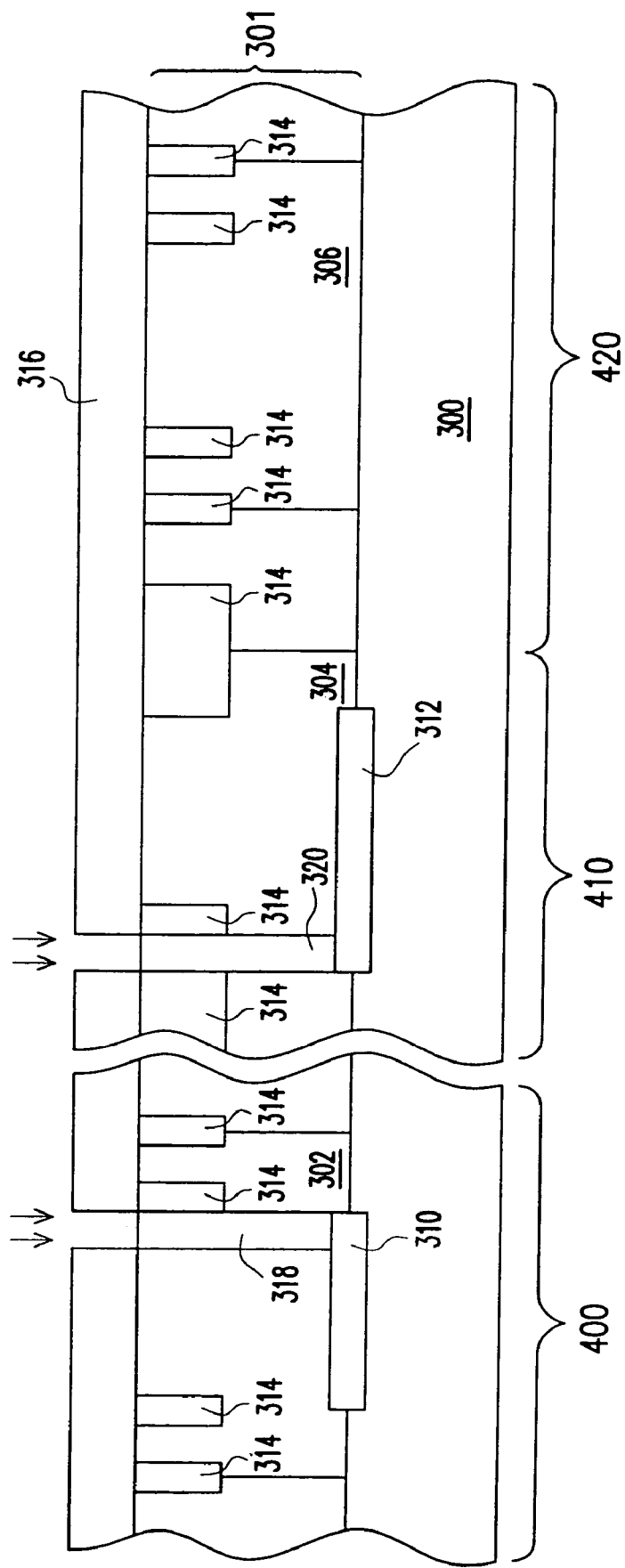

Referring to FIG. 4C, a mask layer 316 is formed, and the surface of the substrate is doped to form sinker layers 318 and 320 in the ESD region 400 and the bipolar region 410. The sinker layers 318 and 320 are electrically connected to the buried layers 310 and 312, respectively. The doping type for the sinker layers 310 and 312 include N type, which is opposite to that of the P wells 302 and 306. The method for forming the sinker layers 318 and 320 includes ion implantation.

Figure 4D:
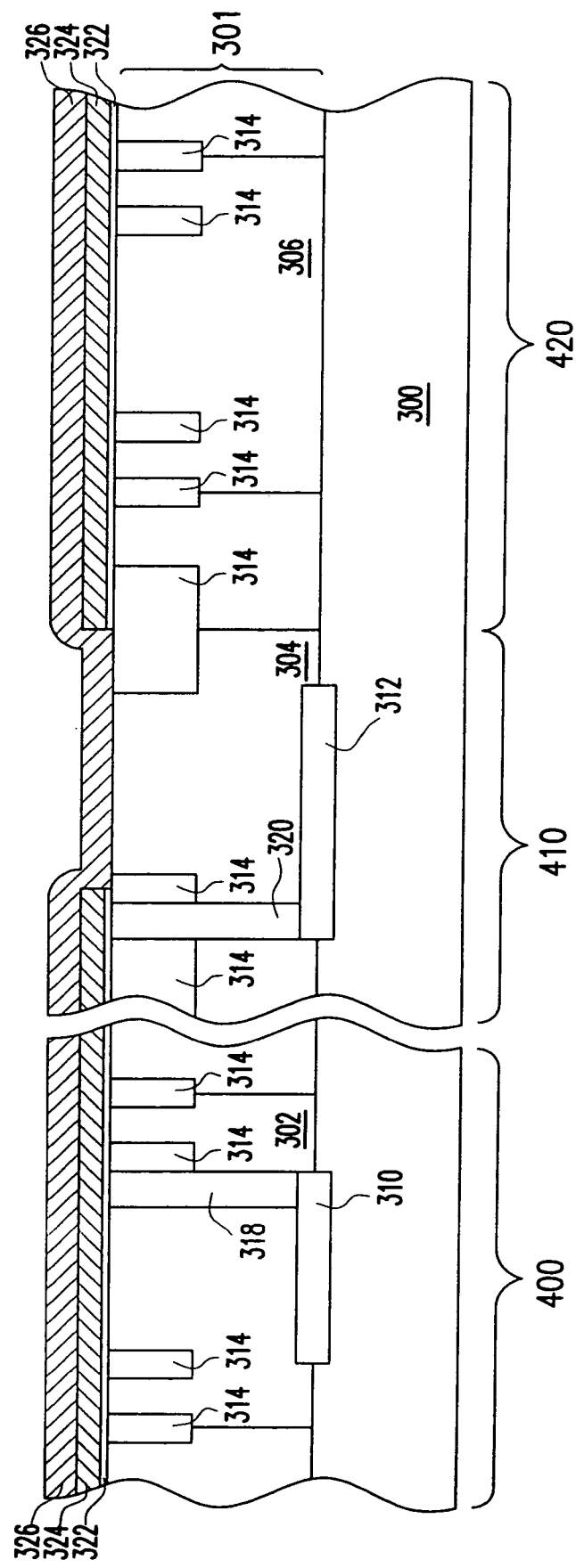

Referring to FIG. 4D, the mask layer 316 is removed. A gate dielectric layer 322 and a conductive layer 324 are formed on surfaces of the ESD region 400, the bipolar region 410 and the CMOS region 420. The gate dielectric layer 322 and the conductive layer 324 on the active region in the bipolar region 410 are removed to expose the surface thereof. A conductive layer 326 is formed to cover the exposed surface of the bipolar region 410.

Figure 4E:
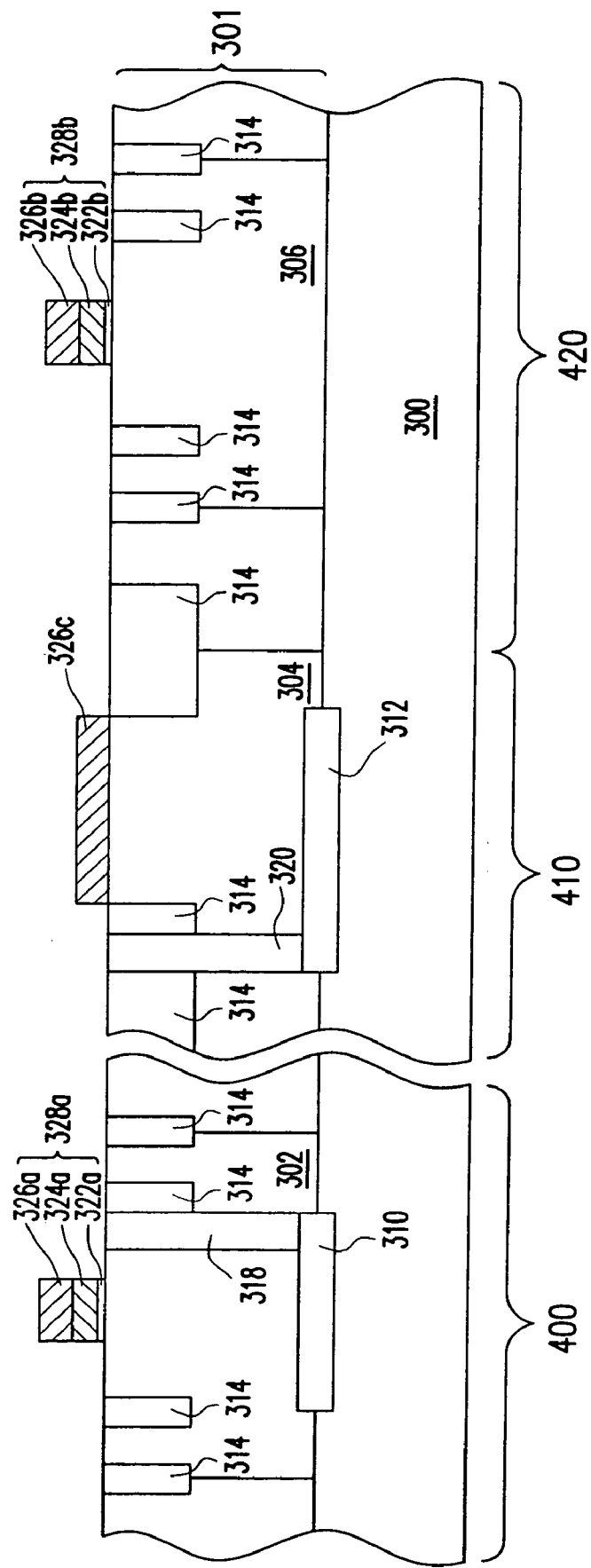

Referring to FIG. 4E, the conductive layer 326, the conductive layer 324 and the gate dielectric layer 322 are patterned into the conductive layers 326a, 326b, the conductive layers 324a, 324b, and the gate dielectric layers 322a, 322b that construct the gates 328a and 328b in the ESD region 400, and the CMOS region 420, respectively, and the conductive layer 326c in the bipolar region 410.

Figure 4F:
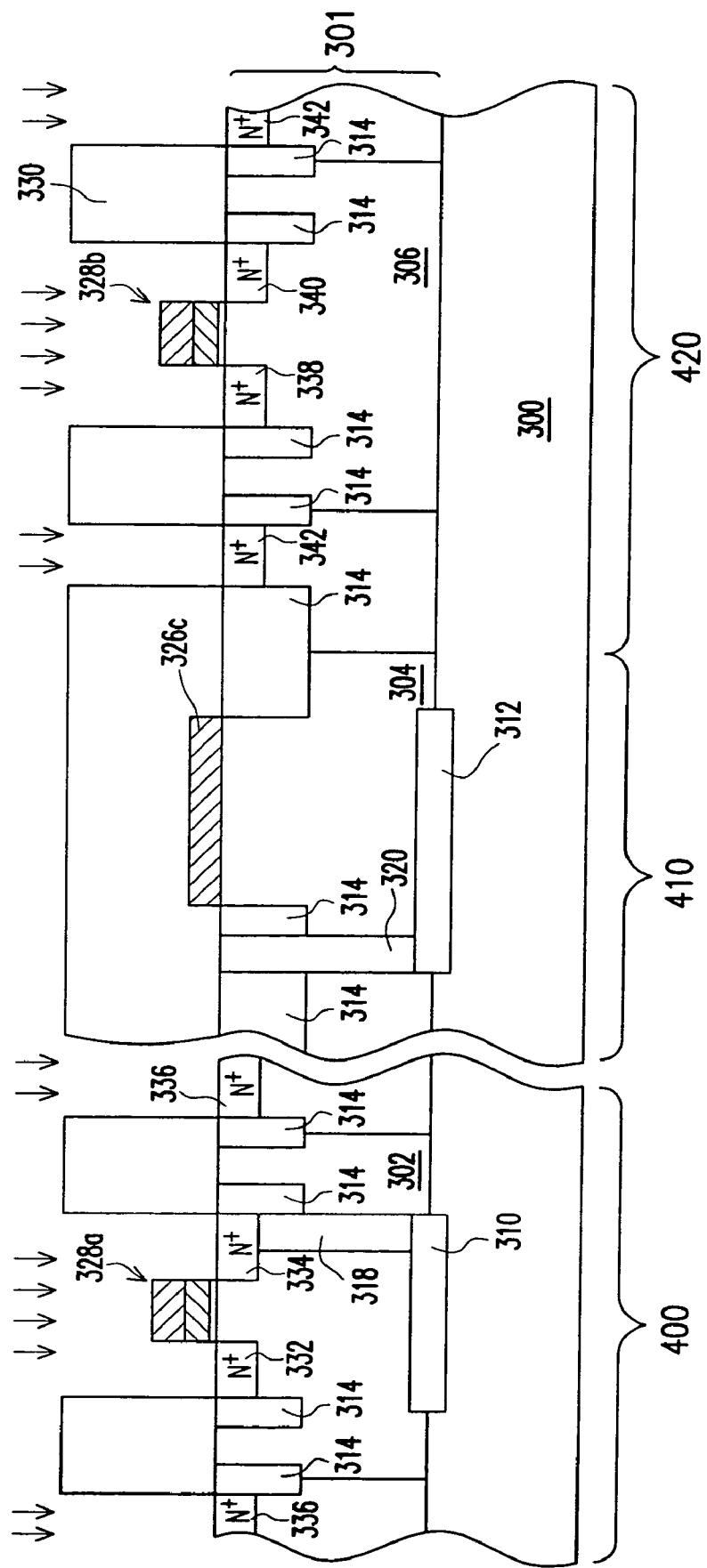

Referring to FIG. 4F, a patterned mask 330 is formed in the ESD region 400, the bipolar region 410 and the CMOS region 420. A doping process is performed with the patterned mask as an implantation mask, so that a source 332 and a drain 334 of an NMOS transistor, and a guard ring 336 are formed in the ESD region 400. Meanwhile, a source 338 and a drain 340 of an NMOS transistor, and a guard ring 342 are formed in the CMOS region 420.

Figure 4G:
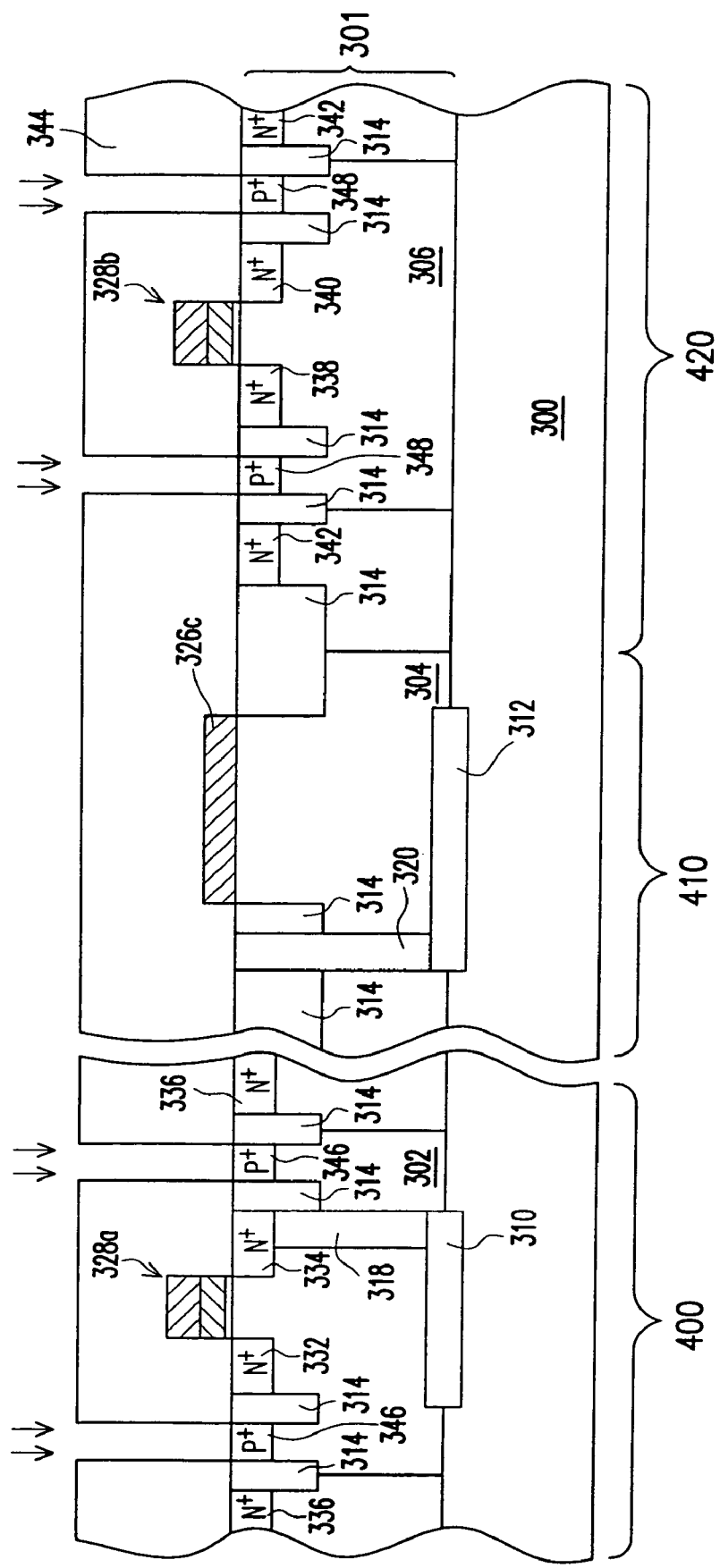

Referring to FIG. 4G, the mask layer 330 is removed. A patterned mask 330 is formed on the ESD region 400, the bipolar region 410 and the CMOS region 420 for performing a doping process. P+ substrate-connecting regions 346 and 348 for the NMOS transistors are formed in the ESD region 400 and the CMOS region 420, respectively.

Figure 4H:
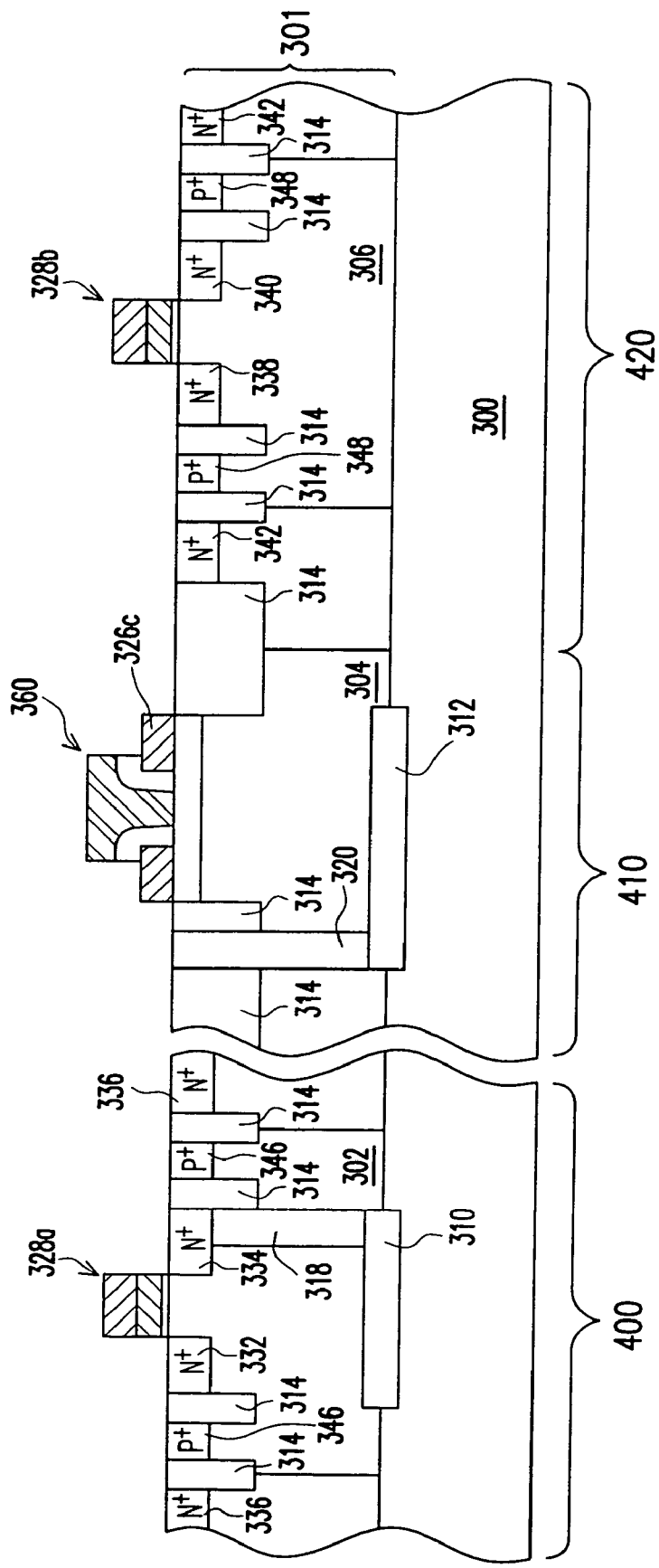

The ESD protection circuit and the CMOS structure are completed by the processes shown up to FIG. 4G. FIG. 4H shows the subsequent process for forming the bipolar transistor. The bipolar transistor 360 is then formed in the bipolar region 410. As the process for forming the bipolar transistor is not essential to the subject matter of the invention, the description thereof is not further introduced.

In the above embodiment, the P type and N type doping regions or impurities can be interchanged with each other.

For the BiCMOS process, the sinker and buried layers of the structure of the electrostatic discharge protection circuit can be formed simultaneously with those of the bipolar transistor. That is, the pattern of the electrostatic discharge protection circuit is considered when designing the photomask. Therefore, in the BiCMOS process, the electrostatic discharge protection circuit with the sinker layer and the buried layer can be formed without introducing additional photomasks.

The above process for fabricating the electrostatic discharge protection circuit is integrated with the BiCMOS process. That is, the electrostatic discharge protection circuit with the sinker layer and the buried layer is formed together with formation of the BiCMOS process. However, the application of the invention is not limited to BiCMOS process only. In fact, the process for fabricating the electrostatic discharge protection circuit can be performed individually or integrated with other processes. Further, such process is not limited in forming the electrostatic discharge protection circuit for NMOS only. The process is also applicable for forming the PMOS electrostatic discharge protection circuit.

According to the above, by forming a buried layer and a sinker layer electrically connected to the buried layer and the sinker layer in the substrate for forming an electrostatic discharge protection circuit, the current flows from the source through the buried and sinker layers to the drain when the electrostatic discharge protection circuit is activated. As the current flows in the substrate, a large current flowing near the surface of the gate dielectric layer is avoided. The gate dielectric layer is thus prevented from being blown. The dielectric strength of the electrostatic discharge protection circuit is improved, and the protection performance thereof is enhanced.

The current path from the source through the sinker and buried layers to the drain allows the heat to dissipate through the substrate, so that dissipation of heat generated by the current is improved. That is, the heat dissipation performance of the electrostatic discharge protection circuit is improved.

In addition, the process for fabricating the electrostatic discharge protection circuit can be integrated with the BiCMOS process. Therefore, the sinker and buried layers of the electrostatic discharge protection circuit can be formed together with those of the bipolar transistor using the same photomask. That is, without increasing any additional photomasks, the buried and sinker layers of the electrostatic discharge protection circuit are formed.

Other embodiments of the invention will appear to those skilled in the art from consideration of the specification and practice of the invention disclosed herein. It is understood that the specification and examples are to be considered as exemplary only, with a true scope and spirit of the invention being indicated by the following claims.

What is claimed is:

1. A method for fabricating an electrostatic discharge protection circuit, comprising:
   providing a substrate;
   forming a well in the substrate, wherein the well is doped with a first conductive type;
   forming a buried layer at a lateral junction between the well and the substrate, wherein the buried layer is doped with a second conductive type;
   forming a sinker layer doped with the second conductive type in the well, wherein the sinker layer is electrically connected to the buried layer;
   forming a gate on the well;
   forming a source and a drain in the well at two sides of the gate, wherein the gate and the source/drain constitute an electrostatic discharge (ESD) transistor, and the drain is directly connected to the sinker layer, such that the sinker layer electrically connects the buried layer with the drain of the transistor and an ESD current flows from the source through the well, the buried layer and the sinker layer to the drain; and
   forming a substrate-connecting region in the well.

2. The method according to claim 1, wherein the step for forming the buried layer includes ion implantation.

3. The method according to claim 1, wherein the step of forming the buried layer includes forming the buried layer with a width extending from the source to the drain under the transistor.

4. The method according to claim 1, wherein the step of forming the sinker layer includes ion implantation.

5. The method according to claim 1, wherein the steps for forming the sinker layer include forming the sinker layer with a width narrower than that of the drain.

6. The method according to claim 1, wherein the first conductive type includes P type and the second conductive type includes N type.

7. The method according to claim 1, wherein the first conductive type includes N type and the second conductive type includes P type.

8. The method according to claim 1, further comprising forming at least an isolation structure between the substrate-connecting region and the source/drain.

9. The method according to claim 1, further comprising forming a guard ring surrounding the substrate-connecting region.

10. The method according to claim 9, further comprising forming at least an isolation structure between the substrate-connecting region and the guard ring.

11. The method according to claim 1, wherein the conductive type of the drain is the same to that of the sinker layer and the conductive type of the sinker layer is the same to that of the buried layer.

* * * * *